United States Patent
Moon

(10) Patent No.: US 10,512,183 B2
(45) Date of Patent: Dec. 17, 2019

(54) CONTROL BOARD ENCLOSURE WITH SLIDING PLATFORM

(71) Applicant: Rheem Manufacturing Company, Atlanta, GA (US)

(72) Inventor: Brandon Moon, Fort Smith, AR (US)

(73) Assignee: Rheem Manufacturing Company, Atlanta, GA (US)

( * ) Notice: Subject to any disclaimer, the term of this patent is extended or adjusted under 35 U.S.C. 154(b) by 41 days.

(21) Appl. No.: 15/849,649

(22) Filed: Dec. 20, 2017

(65) Prior Publication Data
US 2019/0191581 A1    Jun. 20, 2019

(51) Int. Cl.
| H05K 5/06 | (2006.01) |
| H05K 5/00 | (2006.01) |
| H05K 5/03 | (2006.01) |
| H05K 7/14 | (2006.01) |

(52) U.S. Cl.
CPC ........... *H05K 5/061* (2013.01); *H05K 5/0017* (2013.01); *H05K 5/03* (2013.01); *H05K 5/069* (2013.01)

(58) Field of Classification Search
CPC ........ H05K 5/03; H05K 5/061; H05K 5/0017; H05K 5/069; H05K 5/00; H05K 5/1417; H05K 5/1418
See application file for complete search history.

(56) References Cited

U.S. PATENT DOCUMENTS

| 2005/0278075 A1* | 12/2005 | Rasmussen | H02J 9/06 700/286 |
| 2006/0086112 A1* | 4/2006 | Bloemer | F24F 3/153 62/176.6 |
| 2008/0135636 A1* | 6/2008 | Sakai | F24D 11/0214 237/2 B |
| 2010/0193164 A1* | 8/2010 | Wakatsuki | F24F 1/24 165/121 |
| 2011/0192638 A1* | 8/2011 | Soutar | C23C 18/42 174/257 |
| 2011/0232860 A1* | 9/2011 | Lackie | F24F 3/0442 165/59 |
| 2014/0213172 A1* | 7/2014 | Jameson | F24F 7/04 454/284 |

* cited by examiner

*Primary Examiner* — Jinhee J Lee
*Assistant Examiner* — Ingrid D Wright
(74) *Attorney, Agent, or Firm* — King & Spalding LLP

(57) ABSTRACT

A control board enclosure with a slideable platform configured for use within an air handler. The control board enclosure is configured such that the humidity within the enclosure is stabilized or more stable as compared to the more rapid changes in humidity that may be occurring externally. The control board enclosure is substantially sealed or air tight through the use of gaskets, sealant, and/or close fittings that the rapid changes in humidity of the external environment are less likely to affect objects within the enclosure. This humidity stabilization can improve the longevity of the control board stored therein.

19 Claims, 9 Drawing Sheets

CONTROL BOARD ENCLOSURE WITH SLIDING PLATFORM

PRIORITY CLAIM

NONE

TECHNICAL FIELD

Embodiments of the technology relate generally to enclosures for control boards and more particularly to enclosures for control boards for use in air handlers and enclosures for control boards that are sealed, thereby isolating the internally-contained control board from the surrounding air.

BACKGROUND

Replacing control boards within air handlers is a fairly common repair. There are fluctuations in humidity within the air handler that often occur during the on-off cycles of an air handler. The control board is often located within the housing of the air handler, so it too experiences these fluctuations. This exposure to humidity and the often-occurring fluctuations thereof can contribute to the short-circuiting of the control board, necessitating its replacement.

The foregoing background information is provided to reveal information believed by the applicant to be of possible relevance to the present disclosure. No admission is necessarily intended, nor should be construed, that any of the preceding information constitutes prior art against the present disclosure.

SUMMARY

The present disclosure is related to a control board enclosure assembly that can be configured for use within an air handler and to impede air exchange with the air from the surrounding environment. Embodiments within the scope of the present disclosure can isolate the pocket of air within the enclosure from that of the surrounding air. This can facilitate the changes in humidity levels within the enclosure to be stabilized or more stable as compared to the more rapid changes in humidity that may be occurring externally, such as within the housing of an air handler unit.

In one aspect, the present disclosure relates to a control board enclosure assembly comprising a cover configured to couple to a housing wall and defining a space between the housing wall and an inner surface of the cover, an insert comprising a mounting panel, the insert configured to slide inside the cover between a first position within the space and a second position at least partially outside of the space, and a control board coupled to the mounting panel such that the control board is disposed between the mounting panel and the inner surface of the cover when the insert is in the first position and the control board is at least partially outside the space when the insert is in the second position.

In another aspect, the disclosure relates to a method of forming the cover or the insert that comprises folding or cutting a single piece of sheet metal. The cover formed from the method can comprise a front wall, two side walls, two guide tracks and a plurality of mounting tabs. The insert formed from the method can comprise a mounting panel, two side walls, and two slide bars that are configured to slide along the guide tracks of the cover.

These and other aspects will be described further in the example embodiments set forth herein.

BRIEF DESCRIPTION OF THE FIGURES

The foregoing and other features and aspects of the present disclosure are best understood with reference to the following description of certain example embodiments, when read in conjunction with the accompanying drawings, wherein:

FIG. 1A illustrates the control board enclosure assembly having a cover and an insert wherein a portion of the insert is located outside of the cover. FIG. 1B illustrates the control board enclosure assembly wherein the insert is removed from the cover.

FIG. 2A is a side perspective view wherein a portion of the insert is outside of the enclosure. FIG. 2B is a side perspective view wherein the insert is located inside the enclosure.

FIGS. 5A and 5B illustrates a round-shaped cross-section. FIGS. 5C and 5D illustrates a rectangular-shaped cross-section.

Figure 1A:
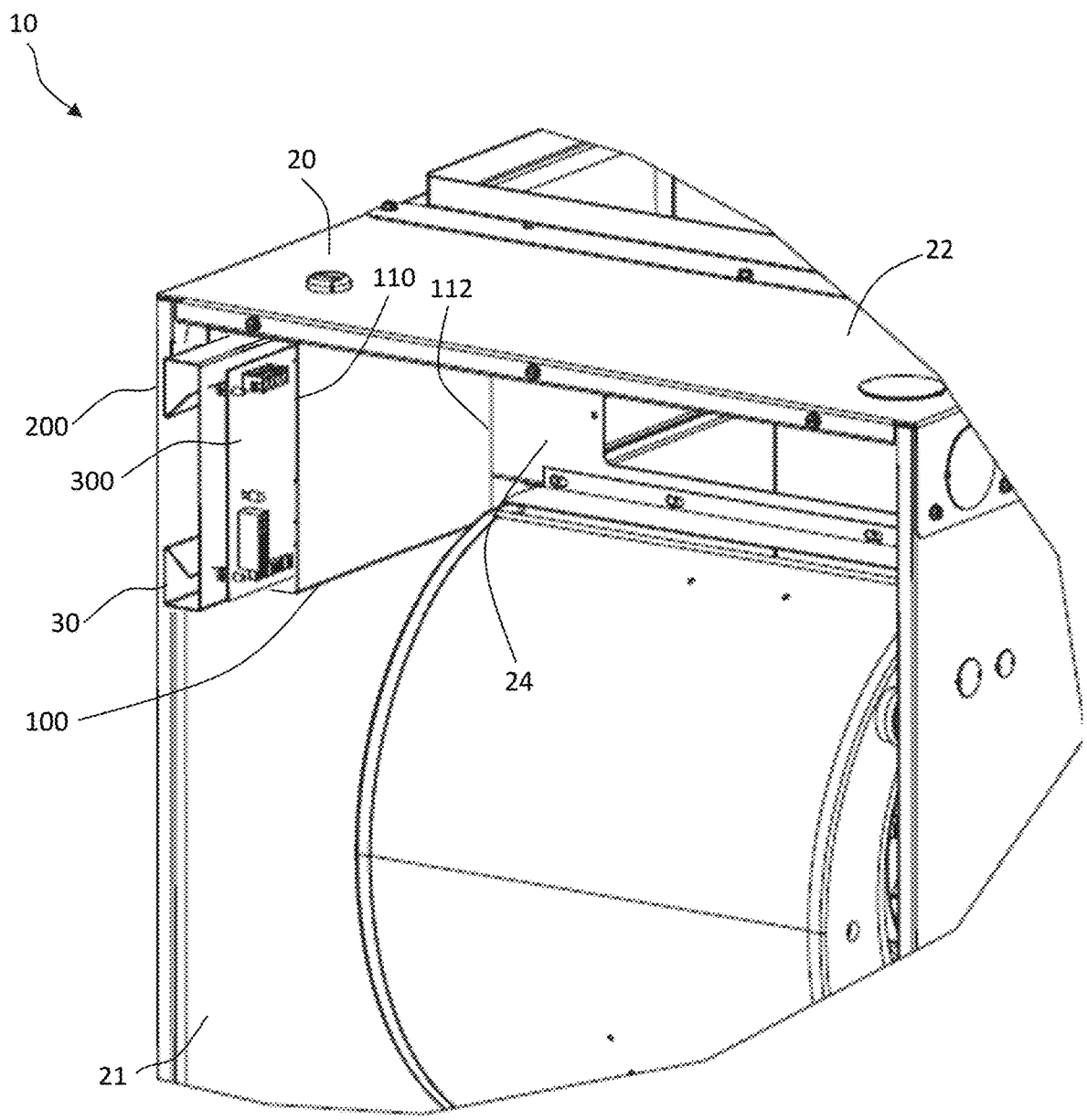
FIGS. 1A and 1B illustrate a cutaway of an air handler unit in which a control board enclosure assembly is disposed in accordance with example embodiments of the present disclosure.

The drawings illustrate only example embodiments of the present disclosure and are therefore not to be considered limiting of its scope, as the present disclosure may admit to other equally effective embodiments. The elements and features shown in the drawings are not necessarily to scale, emphasis instead being placed upon clearly illustrating the principles of the example embodiments. Additionally, certain dimensions or positions may be exaggerated to help visually convey such principles.

In the foregoing figures showing example embodiments of control board enclosures, one or more of the components shown may be omitted, repeated, and/or substituted. Accordingly, the example embodiments of control board enclosures should not be considered limited to the specific arrangements of components shown in any of the figures. For example, features shown in one or more figures or described with respect to one embodiment can be applied to another embodiment associated with a different figure or description.

DETAILED DESCRIPTION OF EXAMPLE EMBODIMENTS

The present disclosure is directed to a control board enclosure that can be configured for use within an air handler and to impede air exchange with the air from the surrounding environment. Embodiments within the scope of the present disclosure can facilitate the humidity levels within the enclosure to be stabilized or more stable as compared to the more rapid changes in humidity that may be occurring externally, such as within the housing of an air handler unit. This isolation may improve the longevity of the control board stored therein.

Some representative embodiments will be described more fully hereinafter with example reference to the accompanying drawings that illustrate embodiments of the disclosure. The disclosure may, however, be embodied in many different forms and should not be construed as limited to the embodiments set forth herein; rather, these embodiments are provided so that this disclosure will be thorough and complete, and will fully convey the scope of the disclosure to those appropriately skilled in the art.

Figure 1B:
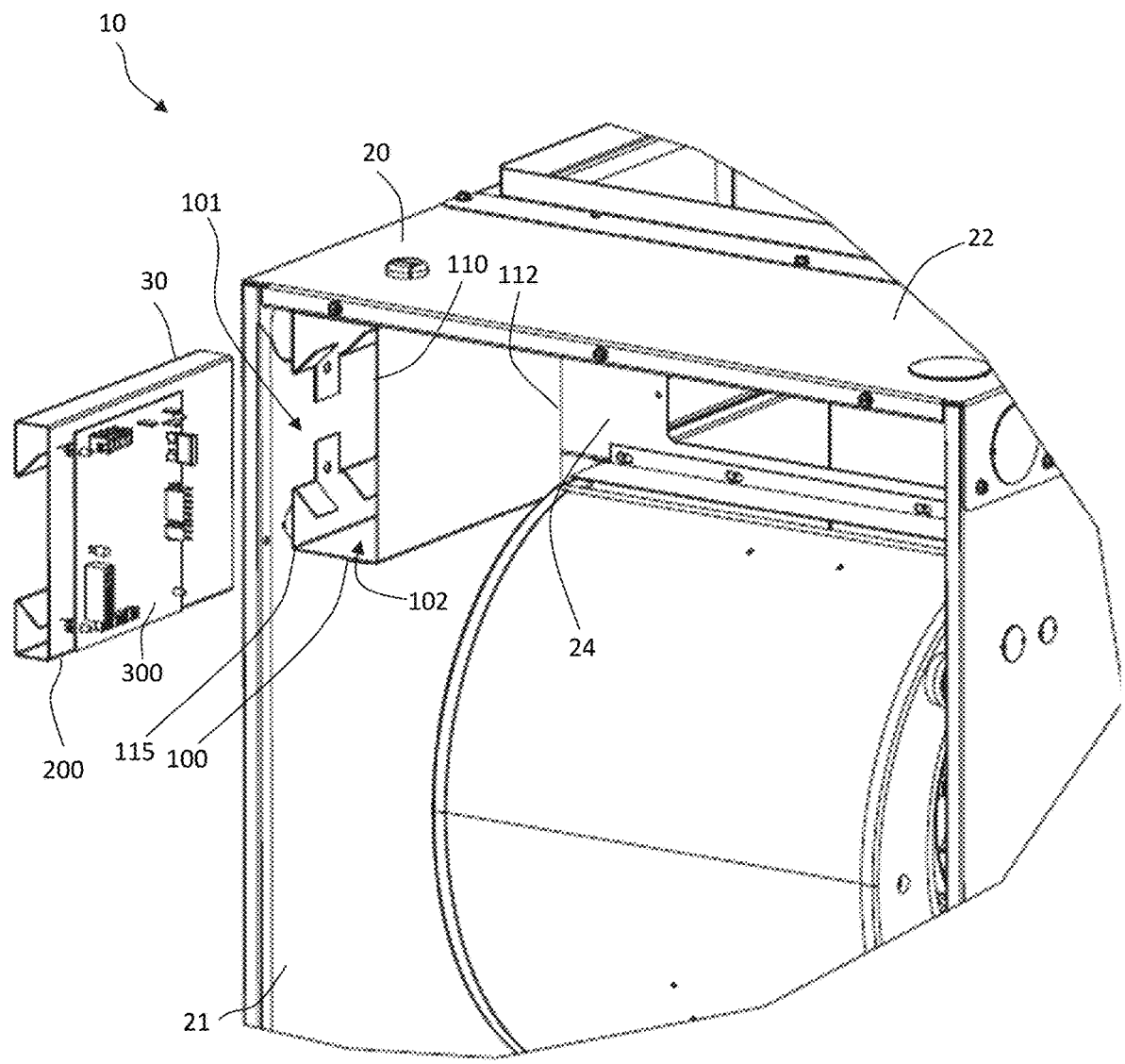

Turning now to the figures, FIG. 1A depicts an air handler unit 10 according to some example embodiments of the disclosure. The air handler unit 10 comprises an air handler housing 20, wherein a control board enclosure assembly 30 is located. The enclosure assembly 30 comprises a cover 100, an insert 200 configured to slide into and at least partially out of the cover 100, and a control board 300 mounted on the insert. FIG. 1B depicts an air handler unit 10 as shown in FIG. 1A except that insert 200 has been removed from the cover 100.

Figure 2A:
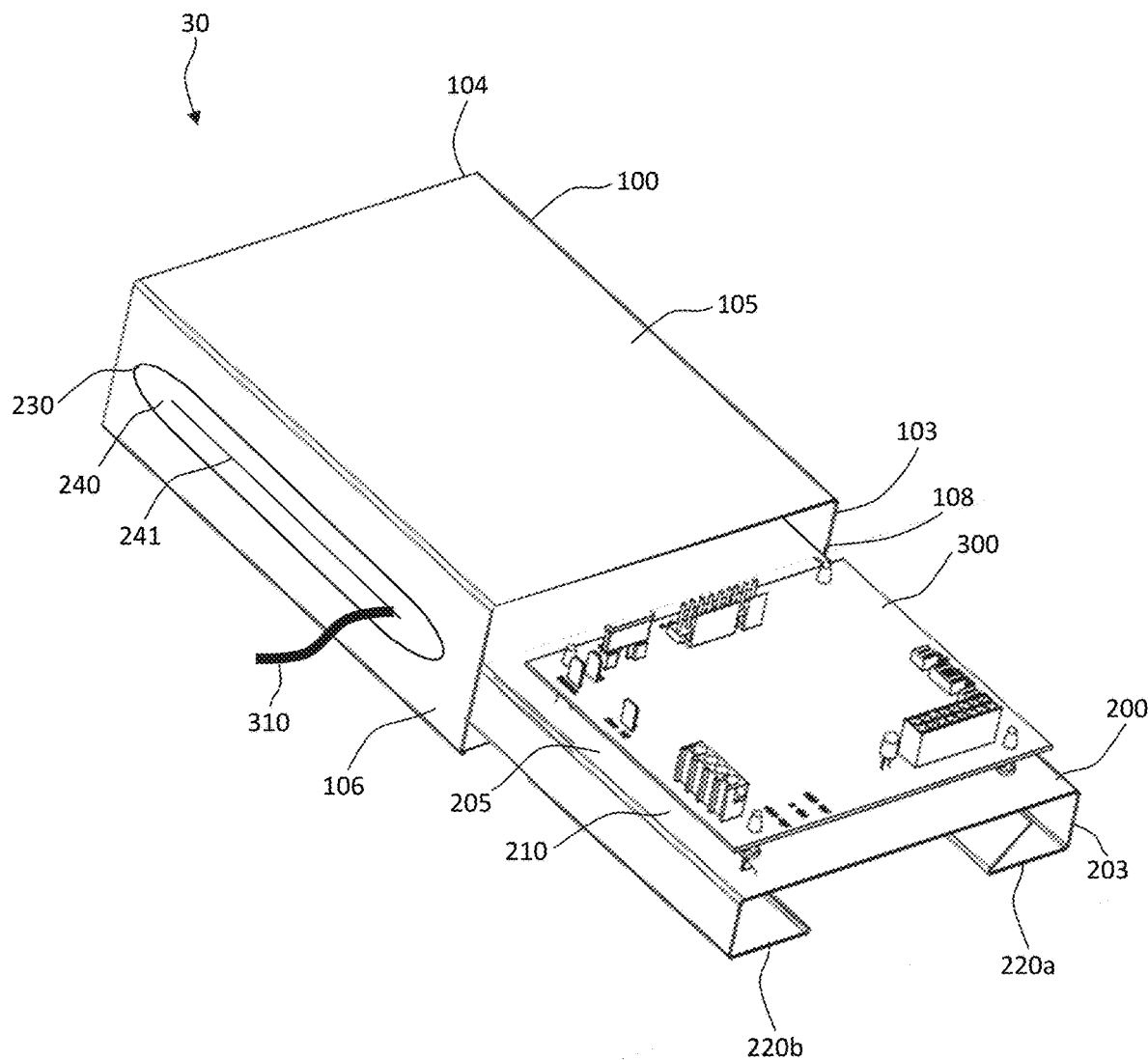
FIGS. 2A and 2B illustrate a control board enclosure and insert with a control board mounted on the insert in accordance with example embodiments of the present disclosure.
Figure 2B:
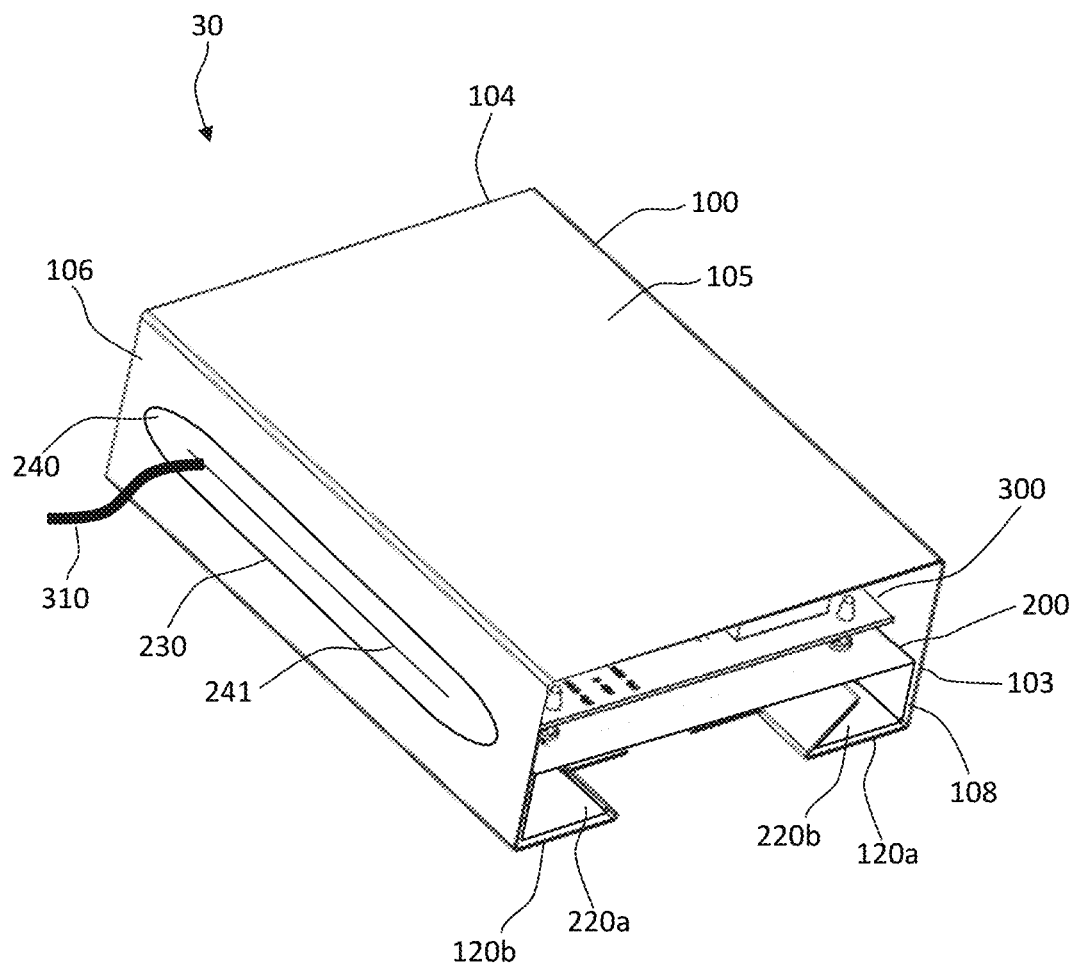
Figure 3A:
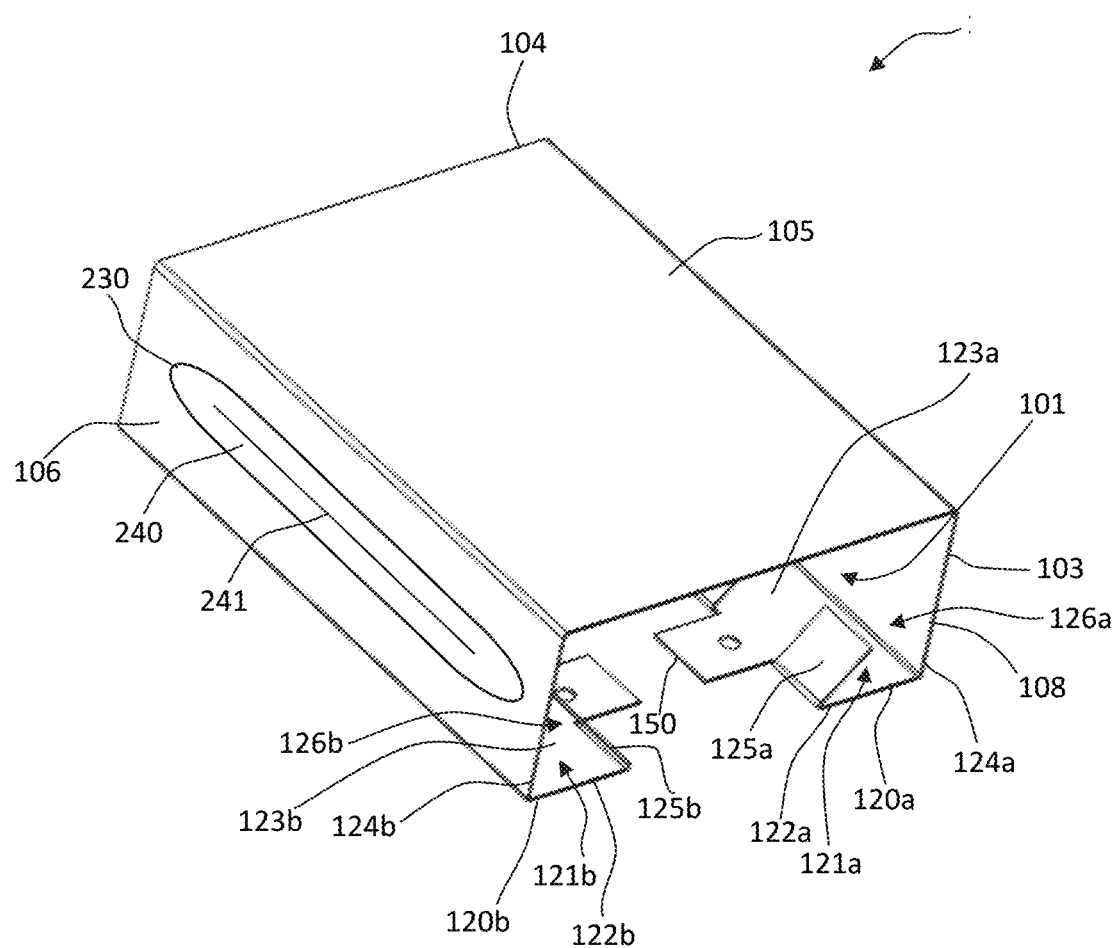
FIGS. 3A and 3B illustrate a front perspective view and a rear perspective view, respectively, of a control board enclosure in accordance with example embodiments of the present disclosure.
Figure 3B:
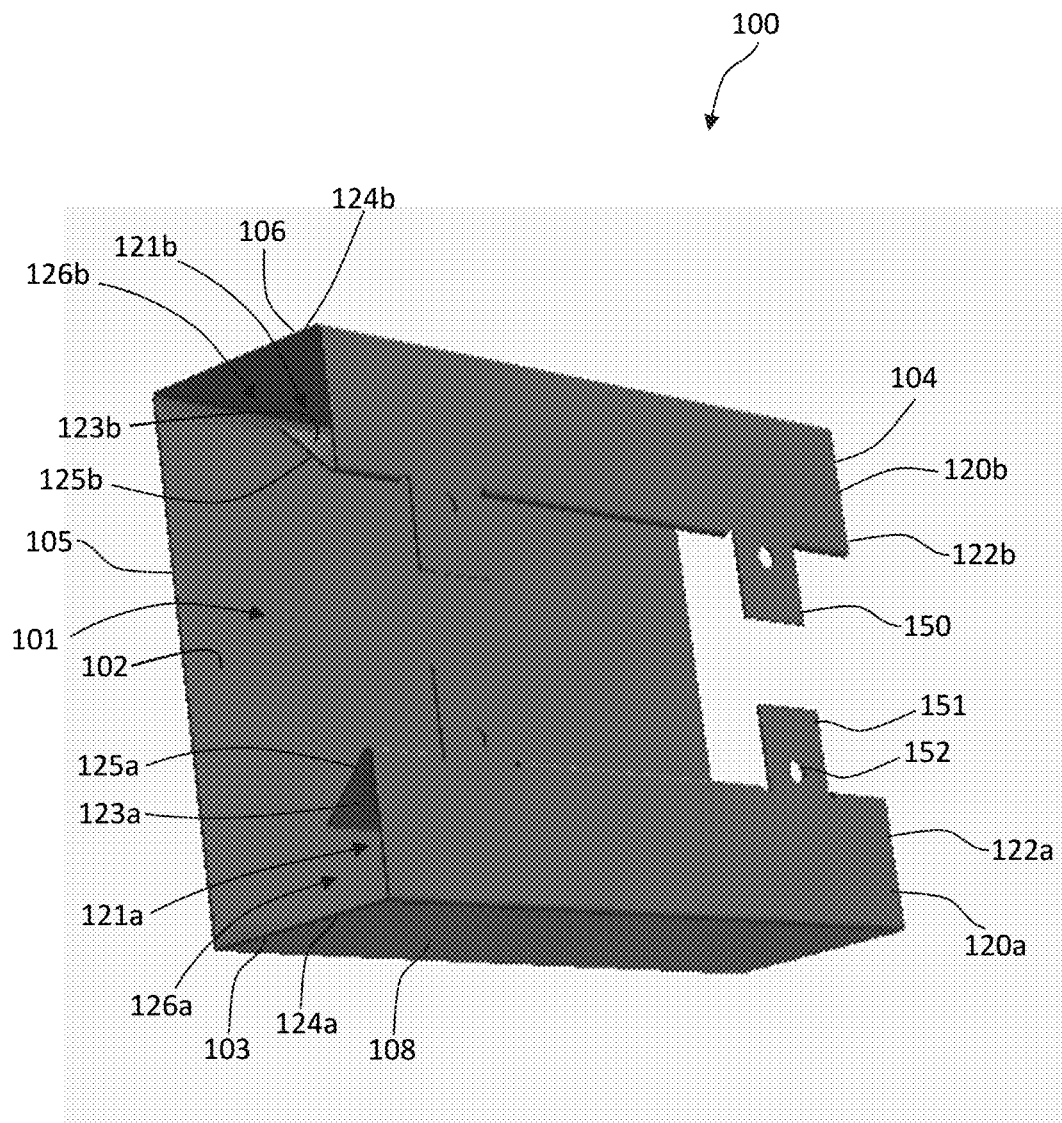
Figure 4A:
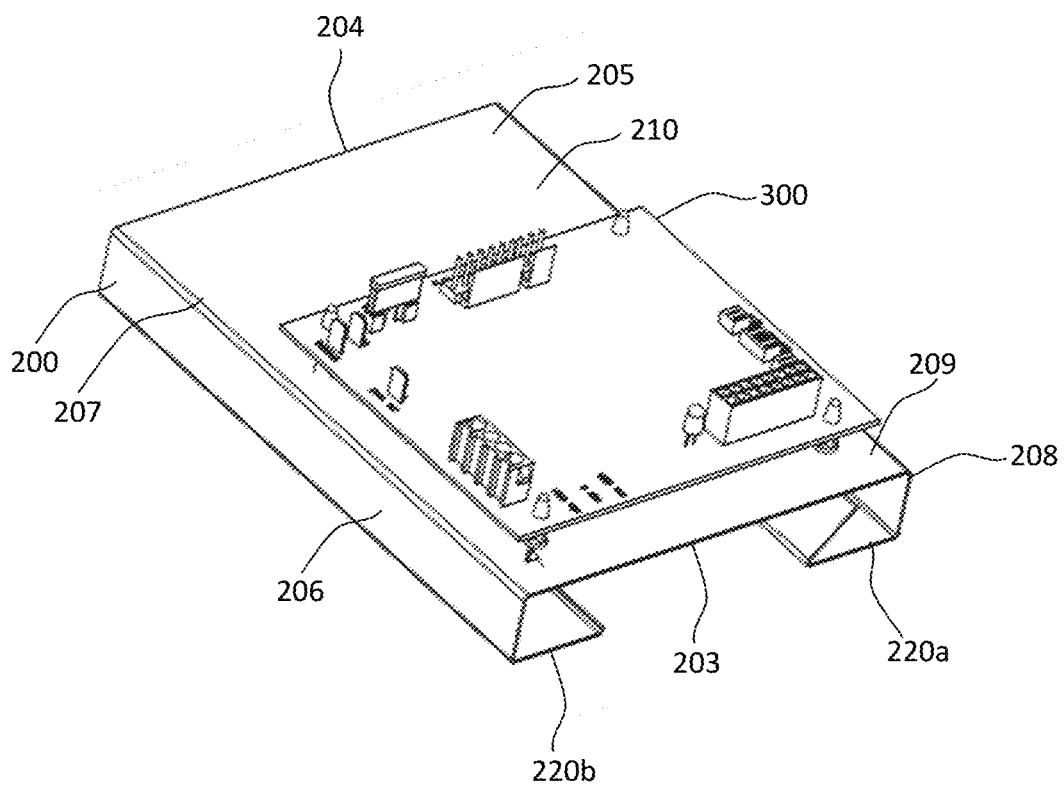
FIGS. 4A and 4B illustrate a front perspective view and a rear perspective view, respectively, of an insert with a control board mounted thereon in accordance with example embodiments of the present disclosure.
Figure 4B:
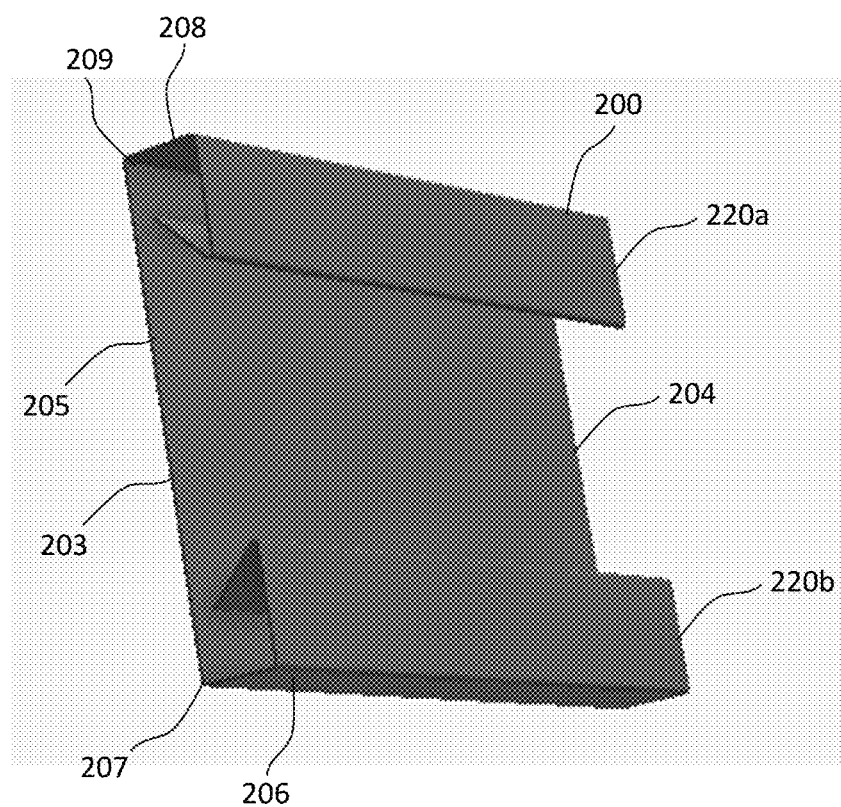
Figure 5A:
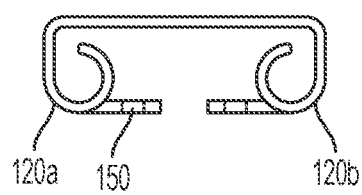
FIGS. 5A to 5D illustrate a close-up, schematic cross-section of a cover 5A and 5C and an insert 5B and 5D in accordance with example embodiments of the present disclosure.
Figure 5C:
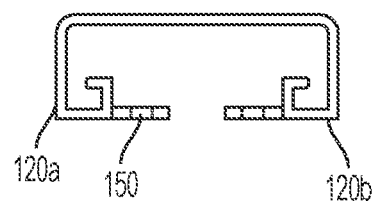
Figure 5B:
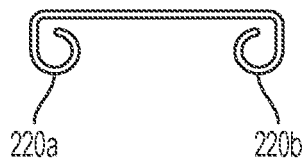
Figure 5D:
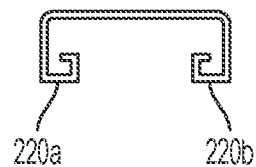

FIGS. 2A-B, 3A-B, and 4A-B depict the enclosure assembly 30 and the components that together form the assembly 30. In particular, FIGS. 2A-B (collectively referred to as FIG. 2) depict the assembly 30 where the insert is shown in two positions, and FIGS. 3A-B and 4A-B depict the cover 100 and the insert 200, individually. FIGS. 3A-B (collectively referred to as FIG. 3) depict the cover 100. FIGS. 4A-B (collectively referred to as FIG. 4) depict the insert 200 and the control board 300 mounted thereon. 5A and 5B depict the cover 100 and the insert 200, respectively for an alternate example configuration of the enclosure assembly. Similarly, FIGS. 5C and 5D depict the cover 100 and the insert 200, respectively, for yet another alternate example configuration of the enclosure assembly.

Air handler unit 10, as shown in FIGS. 1A-B (collectively referred to as FIG. 1), is a device used to regulate and circulate air as part of a heating, ventilating, and air-conditioning (HVAC) system. An air handler unit 10 usually comprises a housing 20 that contains a blower, heating or cooling elements, filter racks or chambers, sound attenuators, dampers, and a control board 300. Air handlers 10 usually connect to a ductwork ventilation system that distributes the conditioned air through the building and returns it to the unit 10, but sometimes air handlers 10 discharge (supply) and admit (return) air directly to and from the space served without ductwork. It is understood that the enclosure assembly 30, while shown in use inside an air handler unit 10, can be used in any area or with any device where it is desired to isolate a control board, such as control board 300, from the surrounding environment. In the embodiment shown, the air handler housing 20 is a box-shaped housing wherein the external walls are generally perpendicular to each other.

With particular reference to FIGS. 1 to 3, the cover 100 of the assembly 30 is configured to couple to a component within an air handler 10, such as an internal or external wall (e.g., a side wall 21, upper wall 22, or internal wall 24) of the housing 20 and define a space 101 (FIG. 1B) between the housing wall 21 and an inner surface 102 of the cover. The cover 100 is shown attached to the housing 20 on a side wall 21. The cover can be configured such that the inner surface 102 is parallel with and faces the housing wall 21. The inner surface 102 extends between the ends 103, 104 of the cover 100.

In the embodiment shown, the cover 100 comprises a front wall 105 defining the inner surface 102 and two side walls 106, 108 (referred to as, a first wall and a second wall, respectively) coupled to the front wall. Each side wall 106, 108 extends between the first end 103 and the second end 104, and the first wall 106 and the second wall 108 face each other. In the embodiment shown, the first wall 106 and the second wall 108 also extend in planes that are parallel to each other and perpendicular to the inner surface 102 of the front wall 105. However, configurations other than that shown with parallel and perpendicular relationships are also envisioned. For example, the first wall 106 and the second wall 108 can extend in planes that form an oblique or acute angle with the front wall inner surface 102.

When installed within air handler 10, the cover 100 can be located and oriented within the housing 20 so that the ends 103, 104 of the cover 100 are sealed by abutting components of the housing or air handler unit 10 at each end. For example, one end 103 (referred to as the first end) is disposed adjacent to and abuts a door or front housing cover (not shown) to the housing 20 when the door or the housing cover closes the housing. The opposite end 104 (referred to as the second end) can similarly be disposed adjacent to and abutting an internal or external wall (e.g., internal wall 24) of the housing 20 that is coupled and perpendicular to side wall 21. The abutment of the first end 103 and the second end 104 facilitates sealing the cover 100 to isolate the interior space 101 between the cover and the housing wall 21 from the external environment.

With particular reference to FIGS. 1, 2, and 4, the insert 200 comprises a mounting panel 205 and is configured to slide inside the cover 100 between a first position (e.g., as shown in FIG. 1B) within the space 101 and a second position (e.g., as shown in FIG. 2A) at least partially outside of the space 101. The control board 300 can couple to the mounting panel 205 such that the control board is disposed between the mounting panel and the inner surface 102 of the cover 100 when the insert 200 is in the first position and the control board is at least partially outside the space when the insert is in the second position.

In the embodiment shown, the insert 200 comprises a mounting panel 205 and two side walls 206, 208 (referred to as, an insert first wall and an insert second wall, respectively) coupled to the mounting panel. Each wall 206, 208 extends between an insert first end 203 and an insert second end 204 which is opposite the insert first end. The insert 200 is configured such that the insert first wall 206 is coupled to a first side 207 of the mounting panel 205 and the insert second wall 208 is coupled to a second side 209 of the mounting panel 205 (opposite the first side 207) and the two walls 206, 208 face each other. In the embodiment shown, the insert first wall 206 and the insert second wall 208 extend in a direction that is opposite to the direction the mounting surface 210 faces. Also, in the embodiment shown, the insert first wall 206 and the insert second wall 208 also extend in planes that are parallel to each other and perpendicular to the mounting surface 210 of the mounting panel 205. However, configurations other than that shown with parallel and perpendicular relationships are also envisioned. For example, the insert first wall 206 and the insert second wall 208 can extend in planes that form an oblique or acute angle with the mounting surface 210.

In some embodiments, the control board enclosure assembly 30 can be configured such that the air within the interior space is different (such as less humid or less corrosive) than the surrounding air, such as that within air handler housing 20. For example, one or more junctions between the cover 100 and the air handler housing 20 can be sealed or substantially airtight. In some embodiments, a gasket or sealant (e.g., caulk) can be disposed at one or both ends (namely, first end 103 and second end 104) of the cover 100 and/or at the junction 115 between a housing wall (e.g., side wall 21) and the guide tracks 120a, 120b (described in more detail below) when the cover is installed, for example, in an air handler unit 10. A gasket is a mechanical seal, usually comprised of a compressible polymeric material, configured to fill the space at a junction. The gasket can be configured to generally impede air exchange at the junction between the cover 100 and, for example, a wall or housing door/cover. A sealant is a curable polymeric material that can be applied to or around the junction and solidify where applied, thereby impeding air exchange at a junction, e.g., sealing a junction. In the embodiment shown, with particular reference to FIG. 1, a first gasket 110 can be coupled to the second end 104 and can be disposed between the second end and the housing door/cover (not shown) when installed in the air handler 10 and the housing door/cover is closed. Similarly, a second gasket 112 is disposed at the second end 104 and can be between the second end and the wall 24 when installed in the air handler 10.

In some embodiments, to stabilize the spatial position of the insert 200, the cover 100 and insert can be configured such that the insert couples to the cover and is moveable relative to the cover along only a linear or radial path. For example, with reference to FIGS. 2B and 3B in particular, the insert 200 can be configured to couple to the cover 100 through at least one guide track 120a, 120b of the cover and slide along the at least one guide track, thereby sliding into and at least partially out of the cover. In some embodiments, the insert 200 can comprise at least one slide bar 220a, 220b that is configured to slide into a corresponding guide track 120a, 120b.

The guide track 120a, 120b can define a channel 121a, 121b, which can be for example, a mostly enclosed channel. The channel can extend lengthwise in a direction that is generally parallel with the junction between the cover first wall 106 and the front wall 105 or cover second wall 108 and the front wall. ("Lengthwise" refers to the long side of an object.) The guide track 120a, 120b can be coupled to the cover first wall 106 or cover second wall 108 and extend (e.g., widthwise) into the interior space 101. In the embodiment shown, the guide track 120a, 120b has a base portion 122a, 122b that extends (e.g., widthwise) perpendicularly to the cover first wall 106 or the cover second wall 108 and into the interior space 101. The guide track 120a, 120b has an interior surface 123a, 123b that defines the channel 121a, 121b and comprises a first portion 124a, 124b spaced apart from a second portion 125a, 125b with a gap region 126a, 126b therebetween. The guide track 120a, 120b can be coupled to the cover first wall 106 or cover second wall 108. In the embodiment shown, the two guide tracks 120a, 120b are inwardly rolled or folded sections of the cover first wall 106 and the cover second wall 108.

The insert 200 can be configured slide relative to the cover 100 along the at least one guide track 120a, 120b, such as two parallel guide tracks as shown. For example, the insert 200 comprises at least one slide bar 220a, 220b that extends between the first end 203 and the second end 204 of the insert and is configured to slide into the channel 121a, 121b of the guide track 120a, 120b. In addition, at least a portion of the insert first wall 206 or the insert second wall 208 can be configured to slide into the gap region 126a, 126b of the at least one guide track 120a, 120b. A slide bar 220a, 220b can be coupled to the insert first wall 206 or the insert second wall 208. In the embodiment shown, each insert wall 206, 208 is coupled to a corresponding slide bar 220a, 220b, such that the bars 220a, 220b are parallel to each other. In the embodiment shown, the slide bar 220a, 220b is an inwardly rolled or folded section of the first wall or the second wall of the insert.

In some embodiments, the slide bar 220a, 220b is configured to closely fit within the channel 221a, 220b. For example, the slide bar 220a, 220b can comprise a cross-sectional profile that is similar to a cross-sectional profile of the channel 121a, 121b such that a portion of the slide bar contacts a portion of the interior surface 123a, 123b of the at least one guide track 120a, 120b. Such configuration can facilitate a smoother sliding action, for example. In addition, such close fitting can impede air exchange between the internal space 101 and the surrounding environment. Similarly, the cross-sectional shape of the cover is similar to a cross-sectional shape of the insert or wherein a cross-sectional profile of the cover is similar to a cross-sectional profile of the insert.

The cross-sectional shape of the channel 121a, 121b or profile of the slide bar 220a, 220b can be any shape, whether straight-sided or curved. FIGS. 1-4 depict a generally triangular cross-section for both the two channels 121a, 121b and the slide bars 220a, 220b. FIGS. 5A and 5B depict a generally round-shaped cross-section for the two channels 121a, 121b and the slide bars 220a, 220b, respectively. FIGS. 5C and 5D depict a generally rectangular-shaped cross-section for the two channels 121a, 121b and the slide bars 220a, 220b, respectively.

To facilitate electrically connecting the control board 300 while still maintaining an isolated interior space, the first wall 106 or the second wall 108 of the cover 100 can define a slot 230 that extends lengthwise parallel with the lengthwise direction of the guide track 120a, 120b and is sized to receive a cable 310 (shown in FIG. 2) connectable to the control board 300. A sealing material 240 (such as a polymeric sheet) can span or cover the slot 230 to impede air exchange and can comprise a slit 241 along which the cable 310 can slide when the insert 200 and control board 300 slides into and at least partially out of the cover 100.

As alluded to above, the cover 100 can be configured to couple to a wall or component (e.g., side wall 21) within an air handler 10. For example, in the embodiment shown, the cover 100 comprises one or more mounting tabs 150 configured to couple with the housing wall 21. The mounting tabs 150 are coupled to portion of the guide tracks 120a, 120b, for example, base portion 122a, 122b. The mounting tabs 150 can extend into the interior space 101.

In some embodiments, the cover 100 or the insert 200 can be formed from a single sheet of metal. Forming the cover 100 (which can include the front wall 105, side walls 106, 108, guide tracks 120a, 120b, and mounting tabs 150) or the insert 200 (which can include the mounting panel 205, side walls 206, 208, and slide bars 220a, 220b) can consist essentially of folding and cutting a single sheet of metal. In other words, no welding or joining of two separate pieces is required to form the cover 100 or the insert 200.

In some embodiments, a sheet metal piece is cut to define the edge(s) 151 of a mounting tab of the cover 100. Similarly, a hole 152 can also be cut (e.g., punched) within the mounting tab. The sheet metal can then be folded or rolled to form at least one guide track 120a, 120b.

In some embodiments, a sheet metal piece is cut (e.g., punched) to define attachment features (not shown) for a control panel 300 to mount on the mounting surface 210 of the insert 200. The sheet metal can then be folded or rolled to form at least one slide bar 220a, 220b.

Many modifications and other embodiments of the disclosures set forth herein will come to mind to one skilled in the art to which these disclosures pertain having the benefit of the teachings presented in the foregoing descriptions and the associated drawings. Therefore, it is to be understood that the disclosures are not to be limited to the specific embodiments disclosed and that modifications and other embodiments are intended to be included within the scope of this application. Although specific terms are employed herein, they are used in a generic and descriptive sense only and not for purposes of limitation.

What is claimed is:

1. A control board enclosure assembly comprising:
a cover configured to couple to a housing wall and define a space between the housing wall and an inner surface of the cover, the cover comprising a first end, a second end opposite the first end, a front wall, a first wall, and a second wall, wherein the first wall and the second wall face each other and wherein the front wall, the first wall, and the second wall extend from the first end to the second end;
an insert comprising a mounting panel, the insert configured to slide inside the cover between a first position within the space and a second position at least partially outside of the space; and
a control board coupled to the mounting panel such that the control board is disposed between the mounting panel and the inner surface of the cover when the insert is in the first position and the control board is at least partially outside the space when the insert is in the second position,
wherein the cover further comprises one or more mounting tabs configured to couple with the housing wall, and
wherein the cover further comprises at least one guide track defining a channel and extending from at least one of the first wall or the second wall and into the space, a portion of the insert configured to slide along the at least one guide track.

2. The control board enclosure assembly of claim 1, wherein a cross-sectional shape of the cover is similar to a cross-sectional shape of the insert or wherein a cross-sectional profile of the cover is similar to a cross-sectional profile of the insert.

3. The control board enclosure assembly of claim 1, wherein the first end abuts a second wall coupled to and adjacent to the housing wall when the cover is installed in an air handler.

4. The control board enclosure assembly of claim 1, wherein the second end abuts a door adjacent to the housing wall when the cover is installed in an air handler.

5. The control board enclosure assembly of claim 3, wherein a gasket is disposed between the first end and the second wall adjacent to the housing wall.

6. The control board enclosure assembly of claim 4, wherein a gasket is disposed between the second end and the door.

7. The control board enclosure assembly of claim 1, wherein the at least one guide track is an inwardly rolled or folded section of the first wall or the second wall of the cover.

8. The control board enclosure assembly of claim 1, wherein the at least one guide track has an interior surface defining the channel and comprises a first portion spaced apart from a second portion and a gap region therebetween.

9. The control board enclosure assembly of claim 8, wherein:
a. the insert comprises a first insert end, a second insert end opposite the first insert end, a first insert wall extending from a first side of the mounting panel, and a second insert wall extending from a second side of the mounting panel,
b. the first insert wall and the second insert wall face each other and extend between the first insert end and the second insert end, and
c. at least a portion of at least one of the first insert wall and the second insert wall is configured to slide into the gap region of the at least one guide track.

10. The control board enclosure assembly of claim 9, wherein the insert comprises a slide bar that extends between the first insert end and the second insert end of the insert and is configured to slide into the channel of the guide track.

11. The control board enclosure assembly of claim 10, wherein the slide bar comprises a cross-sectional profile that is similar to a cross-sectional shape of the channel such that a portion of a surface of the slide bar contacts a portion of the interior surface of the at least one guide track.

12. The control board enclosure assembly of claim 10, wherein the slide bar is an inwardly rolled or folded section of the first insert wall or the second insert wall of the insert.

13. The control board enclosure assembly of claim 1, wherein the first wall or the second wall of the cover defines a slot that extends parallel with the at least one guide track and is sized to receive a cable connectable to the control board.

14. The control board enclosure assembly of claim 13, wherein a sealing material comprising a slit spans the slot.

15. The control board enclosure assembly of claim 1, wherein the cover is coupled to the housing wall of an air handler.

16. The control board enclosure assembly of claim 1, wherein forming the cover consists essentially of folding and cutting a single sheet of metal.

17. The control board enclosure assembly of claim 1, wherein forming the insert consists essentially of folding and cutting a single sheet of metal.

18. A control board enclosure assembly comprising:
a cover configured to couple to a housing wall and define a space between the housing wall and an inner surface of the cover, the cover comprising a first end, a second end opposite the first end, a front wall, a first wall, and a second wall, wherein the first wall and the second wall face each other and wherein the front wall, the first wall, and the second wall extend from the first end to the second end;
an insert comprising a mounting panel, the insert configured to slide inside the cover between a first position within the space and a second position at least partially outside of the space; and
a control board coupled to the mounting panel such that the control board is disposed in the space when the insert is in the first position and the control board is at least partially outside the space when the insert is in the second position,
wherein the cover further comprises one or more mounting tabs configured to couple with the housing wall, and
wherein the cover further comprises at least one guide track defining a channel and extending from at least one of the first wall or the second wall and into the space, a portion of the insert configured to slide along the at least one guide track.

19. A control board enclosure assembly comprising:
a cover configured to couple to a housing wall and define a space between the housing wall and an inner surface of the cover, the cover comprising a first end, a second end opposite the first end, a front wall, a first wall, and a second wall, wherein the first wall and the second wall face each other;

an insert comprising a mounting panel, the insert configured to slide inside the cover between a first position within the space and a second position at least partially outside of the space; and a control board coupled to the mounting panel such that the control board is disposed in the space when the insert is in the first position and the control board is at least partially outside the space when the insert is in the second position, wherein the cover further comprises at least one guide track defining a channel and extending from at least one of the first wall or the second wall and into the space, a portion of the insert configured to slide along the at least one guide track, and wherein at least one of the first wall and the second wall defines a slot that extends parallel to the at least one guide track and is sized to receive a cable connectable to the control board.

* * * * *